United States Patent [19]
Sakurai

[11] 4,381,201
[45] Apr. 26, 1983

[54] METHOD FOR PRODUCTION OF SEMICONDUCTOR DEVICES

[75] Inventor: Junji Sakurai, Tokyo, Japan

[73] Assignee: Fujitsu Limited, Kawasaki, Japan

[21] Appl. No.: 240,130

[22] Filed: Mar. 3, 1981

[30] Foreign Application Priority Data

Mar. 11, 1980 [JP] Japan .................. 55-30623
Mar. 11, 1980 [JP] Japan .................. 55-30624
Apr. 10, 1980 [JP] Japan .................. 55-47346
Apr. 11, 1980 [JP] Japan .................. 55-47656

[51] Int. Cl.$^3$ ............... H01L 21/263; B05D 3/06
[52] U.S. Cl. .............................. 148/1.5; 29/571;
   29/576 B; 148/187; 357/91; 427/53.1
[58] Field of Search ............... 148/1.5, 187; 29/571;
   427/53.1; 357/91; 29/576 B

[56] References Cited

U.S. PATENT DOCUMENTS

| | | | |
|---|---|---|---|
| 3,585,088 | 6/1971 | Schwuttke et al. | 148/174 |
| 3,771,026 | 11/1973 | Asai | 317/234 R |
| 4,044,222 | 8/1977 | Kestenbaum | 219/121 LM |
| 4,187,126 | 2/1980 | Radd et al. | 148/1.5 |
| 4,229,232 | 10/1980 | Kirkpatrick 148 | 1.5/ |
| 4,258,078 | 3/1981 | Celler et al. | 427/43.1 |
| 4,269,631 | 5/1981 | Anantha et al. | 148/1.5 |
| 4,292,091 | 9/1981 | Togei | 148/1.5 |

OTHER PUBLICATIONS

Anantha et al., IBM-TDB, 22 (1979) 575.
Cook et al., Appl. Phys. Letts., 26 (1975) 124.

*Primary Examiner*—Upendra Roy
*Attorney, Agent, or Firm*—Staas & Halsey

[57] ABSTRACT

Various improvements applicable to a method for production of a semiconductor device which is produced on a single crystalline semiconductor layer converted from a non-single crystalline semiconductor layer employing an energy ray irradiation process for conversion of non-single crystalline semiconductor to single crystalline semiconductor, including a process to make a scribing process more efficient realized by producing windows along scribe lines, a process for production of a planer type semiconductor device without damaging a converted single crystalline semiconductor layer realized by interposition of a field oxidation process and an energy ray irradiation process, a process enabling deep and uniform distribution of impurities without lateral diffusion in a semiconductor layer and a process for production of an embedded semiconductor resistor realized by employment of a mask made of a material not to allow radiated heat to pass therethrough, and a process for production of a mesa type semiconductor device not to allow discontinuity of wirings realized by employment of an energy ray irradiation process.

20 Claims, 16 Drawing Figures

METHOD FOR PRODUCTION OF SEMICONDUCTOR DEVICES

BACKGROUND OF THE INVENTION

This invention relates to a method for production of a semiconductor device, more particularly to a group of improvements applicable to a method for production of a semiconductor device which is produced on a single crystalline semiconductor layer which is converted employing an energy ray irradiation process applied to a polycrystalline or amorphous semiconductor layer which is grown on a insulating layer which is produced on a silicon or quartz substrate.

A semiconductor device produced on an insulator has various advantages in comparison with a semiconductor device produced on a monolithic semiconductor substrate, because the parasitic effects are reduced or even eliminated, resulting in a higher integration and higher switching speed of the device. It is widely known that silicon on sapphire and silicon on magnesia spinel are respectively practical and available for potential use.

This category of semiconductor devices has gained more significance, particularly from a practical viewpoint, since the development of a process for converting of polycrystalline silicon or amorphous silicon into single crystalline silicon by irradiating the silicon with a laser or some other energy ray. Practically it is possible to produce a semiconductor device on a single crystalline silicon layer, which has been converted from a polycrystalline silicon layer grown on a silicon dioxide layer formed on a silicon substrate.

Due to the nature of the technical requirements of the energy ray irradiation process for conting of non-single crystalline semiconductor into single crystalline semiconductor, some possibilities remain for further improvement of the various processes. These improvements are based on and utilize the aforementioned crystal structure conversion process, particularly the process of converting polycrystalline silicon into single crystalline silicon by irradiation with a laser or some other energy ray.

Some of the possibilities for further improvement are itemized below:

1. Removing of the difficulty involved with the scribing process for splitting each chip of a finished semiconductor devices due to the increased hardness of the insulating layer. Particularly when scribing a semiconductor substrate or wafer with a diamond cutter, the blade of the cutter is easily damaged. Also, when scribing a semiconductor substrate employing laser cutting process, a longer time or higher power is required, causing drawbacks from the practical viewpoint.

2. Removing the difficulty of making a surface of the converted single crystalline semiconductor layer plain and smooth. Because perforations are required for an insulating layer necessary for the purpose of providing crystal nuclei, it is not necessarily easy to produce a plain and smooth surface on a single crystalline semiconductor layer which is converted from a non-single crystalline semiconductor layer, particularly at the perforations. Further, since a fine patterns are produced on the single crystalline semiconductor layer during the semiconductor device production process, the surface of the single crystalline semiconductor layer must be absolutely plain and smooth.

3. Removing the difficulty in producing of a planar type semiconductor device. It is not necessarily easy to produce a field insulator region for a single crystalline semiconductor layer converted from a non-single crystalline semiconductor layer by an energy ray irradiation process. Therefore, mesa type semiconductor devices have been predominantly produced employing such converted single crystalline semiconductor layers. Since a planar type semiconductor device is preferable rather than a mesa type semiconductor device, this difficulty in producing a planar type semiconductor device is a significant drawback.

4. Removing the possibility of damaging the converted single crystalline semiconductor layer during the high temperature oxidation process used to produce a field oxide layer. Experimental results show that the single crystalline silicon converted from the polycrystalline silicon by an energy ray irradiation process, is easily damaged when exposed to high temperature. Therefore, a method for producing a field oxide layer without damaging the converted single crystalline semiconductor layer is essential for efficient utilization of the process of converting polycrystalline semiconductor to single crystalline semiconductor layer by energy ray irradiation.

5. Developing a process for converting non-single crystalline semiconductor into single crystalline semiconductor without requiring crystal nuclei. A crystal nucleus is usually required as a seed to crystallize molten material. Therefore, a process not requiring crystal nuclei is highly desirable.

6. Developing a process which enables deep and uniform distribution of impurities, without lateral diffusion, in a semiconductor layer. With a heating system employing a furnace, it is difficult to realize deep and uniform distribution of impurities without lateral diffusion, because a wafer is exposed to a high temperature for a relatively long time. This results in an isotropic diffusion with non-uniform Gaussian distribution of impurities. which results in lower integration density semiconductor devices. A high surface impurity density caused by a non-uniform distribution of impurities in depth results in poor crystal quality, and low mobility of carriers. These drawbacks nullifies the various advantages of the process for converting polycrystalline semiconductor into single crystalline semiconductor by energy ray irradiation.

7. Developing a process for producing an embedded semiconductor resistor having a definite and uniform resistance and geometrical accuracy. The essential requirements of an embedded semiconductor resistor are low dispersion of resistance and low lateral diffusion. The former is the basic requirement of a resistor. The latter is necessary to increase the integration density of the device. The deep and uniform diffusion of impurities without lateral diffusion effectively realizes these requirements. However, it is difficult in a diffusion process employing a furnace to achieve the aforementioned deep and uniform diffusion of impurities without lateral diffusion. Therefore, developing a process to form deep and uniform diffusion of impurities without the lateral diffusion referred to in Item 6, can be applied to a process for producing an embedded semiconductor resistor having the desired characteristics noted above.

8. Improving a process for producing a mesa type semiconductor device utilizing a single crystalline semiconductor layer converted from a polycrystalline semiconductor layer by the aforementioned energy ray irradiation process. Albeit it is relatively easy to produce a mesa type semiconductor device rather than a planer type semiconductor device, the surface of the mesa side is rough and the edge of the mesa is sharp. These characteristics the metal wirings produced thereon to break.

SUMMARY OF THE INVENTION

The first object of this invention is to provide a method for producing semiconductor devices which enables easy scribing for spliting each chip of a finished semiconductor device.

The second object of this invention is to provide a method for producing semiconductor devices which enables the production of a single crystalline semiconductor layer converted from a non-single crystalline semiconductor layer by an energy ray irradiation process and having a plain and smooth surface.

The third object of this invention is to provide a method for producing semiconductor devices which simplifies the production of a planar type semiconductor device comprising a single crystalline semiconductor layer converted from a non-single crystalline semiconductor layer.

The fourth object of this invention is to provide a method for producing semiconductor devices wherein a high temperature oxidation process producing a field oxide layer is prevented from damaging a converted single crystalline semiconductor layer.

The fifth object of this invention is to provide a method for producing semiconductor devices which enables conversion of non-single crystalline semiconductor to single crystalline semiconductor without employing crystal nuclei.

The sixth object of this invention is to provide a method for producing semiconductor devices which enables deep and uniform distribution of impurities into a semiconductor layer, without lateral diffusion.

The seventh object of this invention is to provide a method for producing semiconductor devices which includes a process for producing embedded semiconductor resistors having a definite and uniform resistance and an accurate geometry.

The eighth object of this invention is to provide a method for producing semiconductor devices which includes an improved process for producing a mesa type semiconductor device comprising a single crystalline semiconductor layer converted from a polycrystalline semiconductor layer by an energy ray irradiation process.

To attain the above first and second objects, a method for producing semiconductor devices in accordance with the present invention comprises a step of producing a insulating layer on the top surface of a semiconductor substrate, a step to produce windows or grooves in the insulating layer along the linear areas on which scribe lines are to be produced, a step of growing a non-single crystalline semiconductor layer on the top surface of the windowed insulating layer, a step of irradiating the non-single crystalline semiconductor layer with an energy ray such as a photon beam, an ion beam, an electron beam or some other energy ray to convert the non-single crystalline semiconductor layer into a single crystalline semiconductor layer, and steps of selectively producing active and passive elements in the single crystalline semiconductor layer.

Under the category of this embodiment, a modification is available for simplification of the process and for providing flexibility in the selection of a substrate. It is well known that a small recess in a silicon dioxide layer can provide crystal nuclei during the crystallization process. This principle can be utilized to modify this embodiment. The modification comprises a step of producing windows along linear areas, of an insulator type substrate on which scribe lines are to be produced a step or growing a non-single crystalline semiconductor layer on the insulator substrate, a step of irradiating the non-single crystalline semiconductor layer with an energy ray to convert the same to a single crystalline semiconductor layer, and a step of producing various elements on the converted single crystalline semiconductor layer.

To attain the above third and fourth objects, a method for producing semiconductor devices in accordance with the present invention comprises a step of growing a non-single crystalline semiconductor layer on the top surface of a semiconductor substrate, a step of oxidizing selected areas of the non-single crystalline semiconductor layer employing a selective oxidation process, a step of irradiating the non-single crystalline semiconductor layer with an energy ray such as a photon beam, an ion beam, an electron beam or some other energy ray the convert the non-single crystalline semiconductor layer into a single crystalline semiconductor layer, and steps of selectively producing active and passive elements in the single crystalline semiconductor layer.

To attain the above fifth object, a method for producing semiconductor devices in accordance with the present invention comprises an additional step of producing an insulating layer on the top surface of a semiconductor substrate, before executing the series of steps required to attain the above third and fourth objects.

To attain the above sixth and seventh objects, a method for producing semiconductor devices in accordance with the present invention comprises a step of covering selected areas of a semiconductor layer with a mask made of a material which effectively prevents heat, supplied in the form of radiation, from passing therethrough, a step of depositing impurities into the uncovered area of the semiconductor layer, a step of irradiating the uncovered area of the semiconductor layer with an energy ray such as a photon beam, an electron beam, an ion beam or some other energy ray during a short period to melt the semiconductor layer to a limited depth and to then recrystallizing the same causing the deposited impurities to be distributed with an uniform density to a considerable depth, without an appreciable lateral diffusion.

Under the category of this embodiment, a modification is available to prevent potential drawbacks, which may cause unsatisfactory conversion of polycrystalline semiconductor to single crystalline semiconductor and unintentional doping, from occurring. In other words, some types of materials, such as aluminum, if employed to mask the energy ray could react with or could be doped into the semiconductor to be converted into a single crystalline semiconductor thus causing the aforementioned potential drawbacks. To prevent this from occurring, the polycrystalline semiconductor layer to be converted into a single crystalline semiconductor layer is covered by a thin layer of material which is non-reactive with the specific semiconductor and which can not be a dopant for the specific semiconductor. In the case of silicon, silicon dioxide has been found to perform function satisfactorily.

To attain the above eighth object, a method for producing semiconductor devices in accordance with the present invention comprises a step of etching selected portions of a non-single crystalline semiconductor layer grown on an insulating substrate and a step of converting the polycrystalline semiconductor layer into a single crystalline semiconductor layer by an energy ray irradiation process. Thus the surface of a mesa is made smooth and the edge of the mesa gently slopes thus preventing discontinuities of wirings placed thereon.

BRIEF DESCRIPTION OF THE DRAWINGS

The present invention, together with its various features and advantages, can be readily understood from the following more detailed description presented in conjunction with the following drawings, in which.

DESCRIPTION OF PREFERRED EMBODIMENTS

Referring to FIGS. 1 through 4, each step of the first embodiment of the present invention which realize the above first and second objects on a silicon (Si) substrate are described below.

Figure 1:
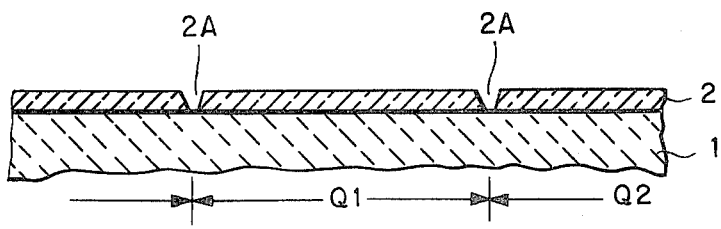
FIG. 1 is a cross-sectional view of a semiconductor substrate after completion of the second step of the method for producing of semiconductor devices in accordance with the first embodiment of the present invention.

Referring to FIG. 1, the first step is a thermal oxidation process oxidizing an N type silicon substrate 1 having a resistance of 0.5 ohm-cm and sliced along the (111) crystalline surface. This oxidation process forms a silicon dioxide ($SiO_2$) layer 2 having the approximate thickness of 1 micrometer.

Thereafter, a conventional photo lithography process is employed to pattern the silicon dioxide layer 2. This patterning process produces windows 2A in the silicon dioxide layer 2 along the linear areas on which scribe lines are to be cut. In this process, accurate window depth is not necessarily required. In other words, it is not necessary to remove the silicon dioxide layer 2 down to the silicon substrate 1.

Figure 2:
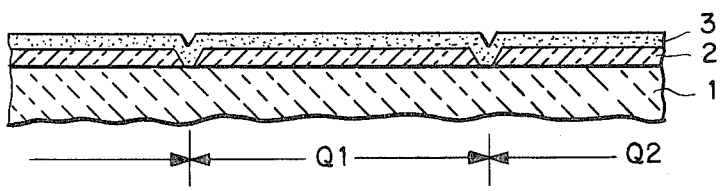
FIG. 2 is a cross-sectional view of a semiconductor substrate after completion of the third step of the method for producing semiconductor devices in accordance with the first embodiment of the present invention.

Referring to FIG. 2, the third step is a chemical vapor deposition process for growing a polycrystalline silicon layer 3 to an approximate thickness of 0.5 micrometers.

Figure 3:
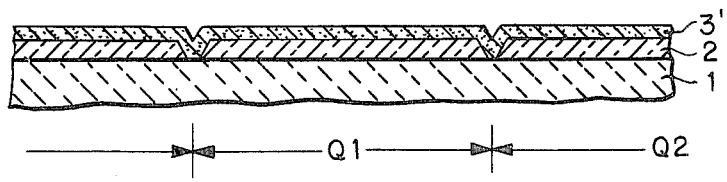
FIG. 3 is a cross-sectional view of a semiconductor substrate after completion of the fourth step of the method for producing semiconductor devices in accordance with the first embodiment of the present invention.

Referring to FIG. 3, the fourth step is to irradiate the polycrystalline silicon layer 3 with a laser beam to convert this layer into a single crystalline silicon layer 3'. Since crystal nuclei are provided by the single crystalline silicon substrate 1 through the windows 2A, no perforations are required in the silicon dioxide layer 2. Therefore, the top surface of each chip $Q_1$, $Q_2$, etc., is readily made plain and smooth.

Figure 4:
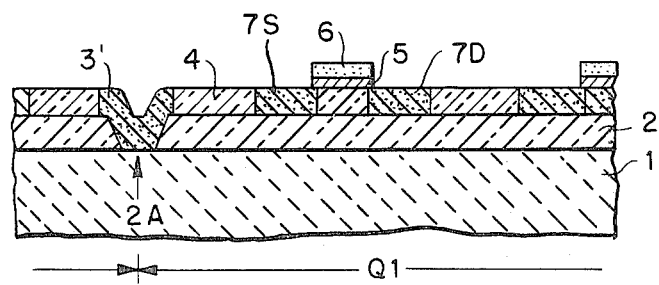
FIG. 4 is a cross-sectional view of a completed semiconductor device produced by the method for producing semiconductor devices in accordance with the first embodiment of the present invention.

The subsequent processing steps are similar to those for producing an ordinary semiconductor device. FIG. 4 illustrates a silicon gate type MIS field effect transistor formed in the single crystalline layer 3'. Specifically FIG. 4, illustrates field oxide layers 4, gate insulating layers 5, silicon gate electrodes 6, source regions $7_S$ and drain regions $7_D$. The normal passivation layers such as a phosphosilicate glass layer (not shown) and wirings (not shown) are then formed.

The final processing step is to split each chip $Q_1$, $Q_2$, etc., of the finished semiconductor device employing a diamond cutter, a laser cutter or some other means. Because the hardness of silicon is much less than that of silicon dioxide, this step can readily be carried out without damaging the blade of the diamond cutter or without requiring a long laser exposure or high laser power.

Thus, in accordance with the first embodiment of the present invention, a method for producing semiconductor devices results in an easy scribing process for splitting each chip of the finished semiconductor device. The method also enables production of a plain and smooth surface of the single crystalline silicon layer converted from the non-single crystalline silicon layer by the energy ray irradiation process.

It is needless to emphasize that the present invention can be realized not only on a silicon substrate but also on a substrate of any type of semiconductor. Further the laser beam employed to convert the polycrystalline silicon layer 3 into a single crystalline silicon layer 3' is only an example. Also, the specific processes for producing the insulating layer and windows described above can be replaced by any other similar process. It is also possible to produce a thin oxide film in the windows, via a reoxidation process.

Figure 5:
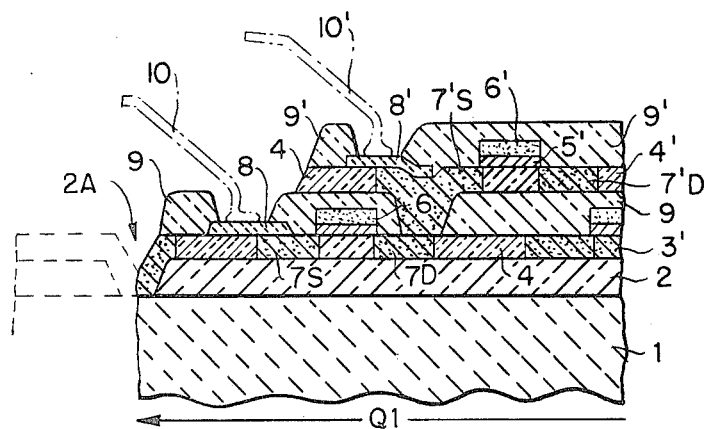
FIG. 5 is a cross-sectional view of a completed multilayered semiconductor device produced by the method for producing semiconductor devices in accordance with the first embodiment of the present invention.

The first embodiment of the present invention can also be employed to produce multi-layered semiconductor devices, such as illustrated in FIG. 5.

FIG. 5 shows a double layered semiconductor device comprising two layers of semiconductor devices, each identical or similar to the semiconductor devices illustrated in FIG. 4. Namely, after electrode pads 8 are placed on the required terminals of various elements included in the first layer of semiconductors, an insulating layer 9 is produced to provide insulation between two layers of semiconductors and the to provide a substrate for the second layer of semiconductors, on top of the semiconductor devices shown in FIG. 4.

Refractory metals such as molybdenum and tungsten are preferable materials for the electrode pads 8 because they function as stoppers during the etching process which forms the contact holes for the specific terminals. This etching is conducted at the very end of the semiconductor device production process.

Therefore, the material for the insulating layer 9 must be selected from a group of materials which can be produced with a low temperature process and which allows a good quality polycrystalline silicon layer to be grown thereon. A result of an example showed that either silicon dioxide or silicon nitride is satisfactory.

The insulator layer 9 is removed from selected areas including the linear areas 2A on the scribe lines and from some areas overlying the terminals of various elements included in the first layer of semiconductor devices, for example 7D shown in FIG. 5.

It is necessary to remove the insulator 9 from a portion of the electrode pads 8 to allow external bonding wires to be contacted in a later process.

A chemical vapor deposition process is employed to grow the polycrystalline silicon layer which is to be converted into the single crystalline silicon layer by an energy ray irradiation process. In this latter process, the linear areas 2A on the scribe lines form the crystal nuclei, because the polycrystalline silicon contacts the single crystalline silicon substrate 1.

A selective oxidation process is employed to produce the field oxide layers 4'. Thereafter, similar semiconductor devices as described in the first embodiment, are produced, and gate oxide layers 5' and gate electrodes 6' are formed. These oxide layers act as masks for the impurities producing source regions $7'_S$ and drain regions $7'_D$. After the electrode pads 8' are formed on the required terminals of the elements included in the second layer of semiconductor devices, an insulator layer 9' is formed for the same purposes as the first insulator layer 9 then three or more semiconductor device layers are formed and for the purpose of passivation when two semiconductor device layers are used.

The insulator layer 9' is selectively removed to expose the electrode pads 8' to expose the second single crystalline layer having no elements or covering the scribe lines.

A photo lithography process is employed to remove the second single crystalline layer exposed during the previous process.

Additionally, another photo lithography process is employed to remove the insulator layer 3' thus exposing the electrode pads 8.

A scribing process is employed to split each chip, $Q_1$, $Q_2$, etc., along the scribe lines 2A. Since the scribing lines are covered only by the single crystalline silicon layer 3', this scribing process is extremely easy. Particularly, if the silicon layer 3' overlying on the scribe lines is over-etched, the burden of this scribing process is considerably reduced.

Finally, after each chip is mounted in a package the external wirings 10, 10' etc. are bonded onto the electrode pads 8, 8' etc.

Thus, in accordance with the aforementioned series of steps, a double layered semiconductor device comprising two layers of semiconductor devices wherein the first layer is identical to the semiconductor device illustrated in FIG. 4 and the second layer is similar to the semiconductor device illustrated in FIG. 4.

From a practical viewpoint, a modification of the above embodiment is provided, because a greater simplification of the process and more flexibility in selection of materials would be significant to expand the concept of this embodiment. In accordance with the modification, the limitation on the selection of materials is removed. In other words, any type of insulator can be employed as the substrate; for example Quartz. Further, the present invention eliminates the production of an insulator layer, a portion of which must be removed to expose the underlying single crystalline semiconductor to provide crystal nuclei. This modification is based on the principle a small recess can function as a crystal nucleus. The essential step of this modification is the formation of grooves on an insulator substrate along the linear areas on which scribe lines are to be produced. The polycrystalline silicon layer to be converted into a single crystalline silicon layer by an energy ray irradiation process is then grown on the grooved substrate.

Figure 6:
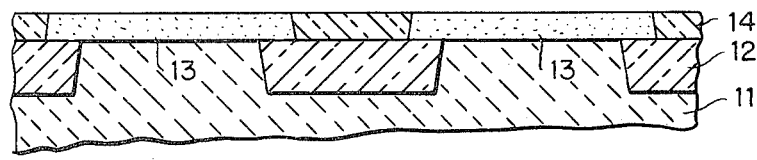
FIG. 6 is a cross-sectional view of a semiconductor substrate after completion of the third step of the method for producing semiconductor devices in accordance with the second embodiment of the present invention.
Figure 7:
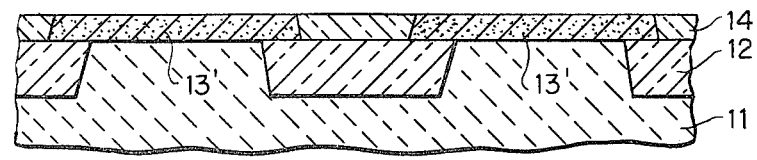
FIG. 7 is a cross-sectional view of a semiconductor substrate after completion of the fifth step of the method for producing semiconductor devices in accordance with the second embodiment of the present invention.
Figure 8:
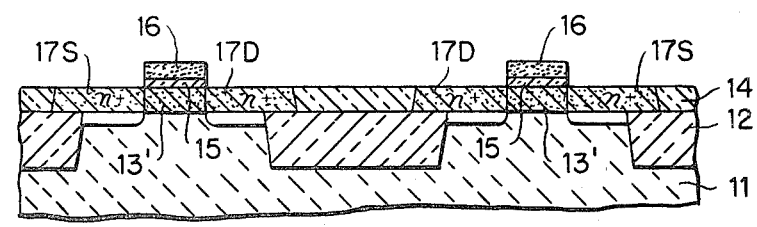
FIG. 8 is a cross-sectional view of a completed semiconductor device produced by a method for producing semiconductor devices in accordance with the second embodiment of the present invention.

Referring to FIGS. 6 through 8, each step of the second embodiment of the present invention realizing the above third and fourth objects on a silicon substrate is described below.

Referring to FIG. 6, the first step is to selectively, termally oxidize a P type silicon substrate 11 which is sliced along the (100) crystalline surface, to produce embedded field oxide layers 12 having the approximate thickness of 1 micrometer.

After removing the masks of silicon nitride ($Si_3N_4$) and silicon dioxide (not shown) employed in the above selective thermal oxidation process, a chemical vapor deposition process is employed to grow a polycrystalline silicon layer 13 having the approximate thickness of 4,000 angstroms.

The third step is to selectively, thermally oxidize to form the embedded field oxide layers 14.

Referring to FIG. 7, the fourth step is to remove the masks of silicon nitride and silicon dioxide (not shown) employed in the above selective thermal oxidation process.

The fifth step is to irradiate the polycrystalline silicon layer 13 with a laser beam to convert the layer into a single crystalline silicon layer 13'. An experimental result showed that a Q switched YAG laser of 2W having the approximate beam diameter of 50 micrometers is effective to convert a 4,000 angstrom polycrystalline silicon layer into a single crystalline silicon layer.

The subsequent processing steps are similar to those for producing of an ordinary semiconductor device. FIG. 8 illustrates the gate insulating layers 15, silicon gate electrodes 16, source regions $17_S$, drain regions $17_D$. Finally, passivation layers (not shown) and wirings (not shown) are then formed.

Note that the single crystalline silicon layer 13' is not exposed to high temperature processing. Therefore, it is possible to produce not only mesa type semiconductor devices but also planar type semiconductor devices. Thus the second embodiment of the present invention provides a method for producing semiconductor devices which enables easy production of a planar type semiconductor device and which prevents a high temperature oxidation process for from damaging the single crystalline silicon layer converted from a polycrystalline silicon layer by energy ray irradiation process.

Particularly, the second embodiment of the present invention can be utilized in producing either a chip or individual elements on a chip. Further, the second embodiment of the present invention can also be employed to produce multi-layered semiconductor devices. It is particularly efficient to use the first embodiment to produce the first semiconductor device and the second embodiment to produce the subsequent semiconductor layers.

Figure 9:
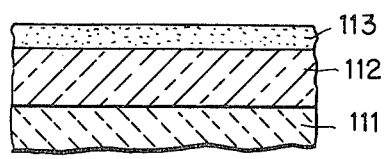
FIG. 9 is a cross-sectional view of a semiconductor substrate after completion of the second step of the method for production of semiconductor devices in accordance with the third embodiment of the present invention.
Figure 10:
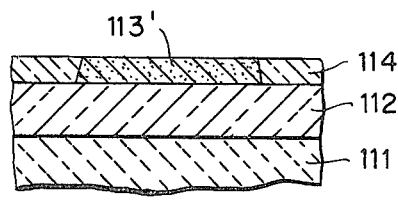
FIG. 10 is a cross-sectional view of a semiconductor substrate after completion of the fifth step of the method for producing semiconductor devices in accordance with the third embodiment of the present invention.

Referring to FIGS. 9 and 10, the essential steps of the third embodiment of the present invention, realizing the above fifth object on a silicon substrate are described below.

Referring to FIG. 9, the first step is to oxidize the top surface of a silicon substrate 111 to form the silicon dioxide layer 112 having an approximate thickness of 1 micrometer.

The second step is to grow by a chemical vapor deposition process, a polycrystalline silicon layer 113, having an approximate thickness of 4,000 angstroms, on top of the silicon dioxide layer 112.

Referring to FIG. 10, the third step is to selectively, thermally oxidize the polycrystalline silicon layer to form embedded field oxide layers 114.

The fourth step is to remove the masks of silicon nitride and silicon dioxide (not shown) employed in the above selective thermal oxidation process.

The fifth step is to irradiate the polycrystalline silicon layer 113 with a laser beam to convert the layer into the single crystal silicon layer 113'. Noted in this step no crystal nuclei are used for the crystallization. The reason why the molten silicon crystallizes into a single crystalline silicon is that (a) the molten silicon is in the super-saturated state in a relatively small confined space, and (b) the molten silicon is rapidly cooled.

The subsequent steps are similar to the production of an ordinary semiconductor device. Therefore, it is also noted that the single crystalline silicon layer 113' is not exposed to high temperature.

Thus, in accordance with the third embodiment of the present invention, a method for producing of semiconductor devices which enables conversion of a polycrystalline silicon layer into a single crystalline silicon layer without crystal nuclei, is provided.

The third embodiment of the present invention, it is similar to the second embodiment, therefore applications similar to those of the second embodiment are assumed for the third embodiment. Accordingly, it is particularly efficient to use the first embodiment to produce the first semiconductor device layer and the third embodiment produce the subsequent semiconductor device layers.

Figure 11:
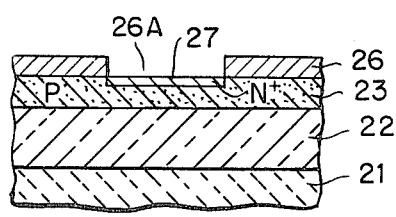
FIG. 11 is a cross-sectional view of a semiconductor substrate after completion of the eighth step of the method for producing semiconductor devices in accordance with the fourth embodiment of the present invention.
Figure 12:
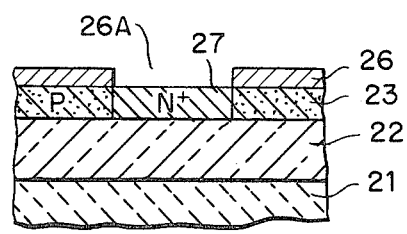
FIG. 12 is a cross-sectional view of a semiconductor substrate after completion of the ninth step of the method for producing semiconductor devices in accordance with the fourth embodiment of the present invention.

Referring to FIGS. 11 and 12, the essential steps of the fourth embodiment of the present invention, realizing the above sixth and seventh objects are described. Specifically this embodiment produces an embedded semiconductor resistor in addition a semiconductor device, on a single crystalline silicon layer is converted from a polycrystalline silicon layer by an energy ray irradiation process.

Referring to FIG. 11, the first step is to oxidize the top surface of a silicon substrate 21 to form the silicon dioxide layer 22 having an approximate thickness of 1 micrometer.

The second step is to grow, by a chemically vapor deposition process, a polycrystalline silicon layer having an approximate thickness of 0.5 micrometers.

The third step is an ion implantation of boron B+ ions to an approximate density of $1 \times 10^{16}/cm^3$.

The fourth step is the irradiation of the polycrystalline silicon layer with a laser beam to convert this layer into a P type single crystalline silicon layer 23.

The fifth step is the formation of various elements (not shown) on the P type single crystalline silicon layer 23. It is noted that although high temperature processes are included in this step, no high temperature processes are included in subsequent steps.

The sixth step is the evaporation of an aluminum layer 26 on the P type single crystalline silicon layer 23. Aluminum is selected because it readily reflects energy rays, and allows little heat to pass therethrough. Accordingly, the aluminum layer functions to prevent heat in the form of radiation, from being transmitted to the P type single crystalline silicon layer 23. Further, any other material which prevents heat from passing therethrough can be substituted for aluminum.

The seventh step is the photo lithography patterning of the aluminum layer 23, and the production of opening 26A through which impurities are to be implanted.

The eighth step is an ion implantation of arsenic ($A_S^+$) through the opening 26A of the aluminum mask 26 into the P type single crystalline silicon layer 23 to form a shallow region 27 comprising N type impurities in the P type single crystalline silicon layer 23.

Referring to FIG. 12, the ninth step is laser annealing. This annealing melts the single crystalline silicon in the region in which arsenic was implanted in the eighth step. Molten silicon is then crystallized which results in the arsenic diffusing into the single crystalline silicon layer 23 to a uniform density and a considerable depth, the activating of the diffused arsenic. Note that the region of the P type single crystalline silicon layer 23 covered by the aluminum mask 26 is not melted, and thus remains as single crystalline silicon to provide a crystal nuclei. Accordingly, the molten silicon implanted with arsenic is crystallized and the arsenic uniformly diffuses in to the region confined by the silicon dioxide layer 22 and the non-molten P type single crystalline silicon layer 23. As a result, an embedded semiconductor resistor having a sufficiently low resistance uniform and is accurately formed in the shape of the diffused region.

The subsequent steps are similar to those for producing an ordinary semiconductor device.

Thus, in accordance with the fourth embodiment of the present invention, comprises a method for producing semiconductor devices which enables the formation of self-aligned, deeply and uniformly diffused impurities in a semiconductor layer, particularly in a single crystalline semiconductor layer converted from a polycrystalline semiconductor layer by an energy ray irradiation process. Further, the fourth embodiment enables the production of an embedded semiconductor register having a definite and uniform resistance which is accurately shaped.

Note in the fourth embodiment the semiconductor into which impurities are implanted, is not limited to single crystalline semiconductor. In other words, a polycrystalline or amorphous semiconductor is acceptable. In the case of amorphous semiconductor, the recrystallized semiconductor becomes a polycrystalline semiconductor.

It is particularly efficient to employ the fourth embodiment in combination with the first, second or third embodiment of the present invention.

Depending on the material used to mask the energy ray irradiation, various drawbacks can occur. For example, aluminum can be a dopant for silicon and even react with silicon, particularly at the edge of the mask. This can lead to the crystallization being prohibitted and/or unintentional doping occurring. To prevent these potential drawbacks from occurring, the silicon layer to be converted into a single crystalline silicon layer is covered with a material which reacts minimally with silicon and is not qualified as a dopant for silicon. It has been determined that a silicon dioxide layer performs this function excellently without any adverse effects.

Figure 13:
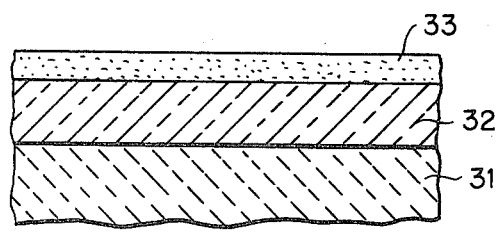
FIG. 13 is a cross-sectional view of a semiconductor substrate after completion of the second step of the method for producing semiconductor devices in accordance with the fifth embodiment of the present invention.
Figure 14:
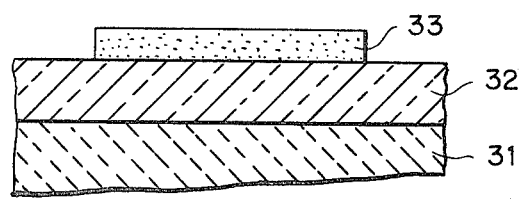
FIG. 14 is a cross-sectional view of a semiconductor substrate after completion of the third step of the method for producing semiconductor devices in accordance with the fifth embodiment of the present invention.
Figure 15:
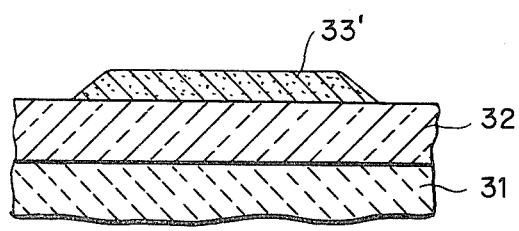
FIG. 15 is a cross-sectional view of a semiconductor substrate after completion of the fourth step of the method for producing semiconductor devices in accordance with the fifth embodiment of the present invention.

Referring to FIGS. 13 through 15, each step of the fifth embodiment of the present invention, realizing the above eighth object is described. Specifically, the production of a mesa type semiconductor device utilizing a single crystalline semiconductor layer converted from a polycrystalline semiconductor layer by an energy ray irradiation process.

Referring to FIG. 13, the first step is the thermal oxidation of the silicon substrate 31 to form the silicon dioxide layer 32 having an approximate thickness of 1 micrometer. The second step is to grow by a chemical vapor deposition process a polycrystalline silicon layer 33 having an approximate thickness of 5,000 angstroms.

Referring to FIG. 14, the third step is a photo lithography process to form a mesa of to the polycrystalline silicon layer 33. In this step, the condition of the surface of the mesa side and/or to the edge of the mesa is irrelevant.

Referring to FIG. 15, the fourth step is the irradiation of the polycrystalline silicon layer 33 with a laser beam to convert this layer into a single crystalline silicon layer 33'. An experimental result showed that a Q switched ruby laser of 2 joules effectively converts the polycrystalline silicon layer having an approximate thickness of 5,000 angstroms. This step makes the surface of the mesa side smooth and the edge of the mesa gently sloping. As a result, the wirings placed on the mesa are prevented from being broken.

The subsequent steps are similar to those for producing an ordinary semiconductor device.

Figure 16:
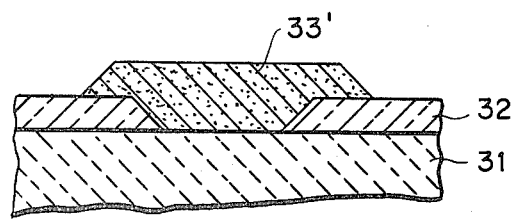
FIG. 16 is a cross-sectional view of a semiconductor substrate, corresponding to FIG. 15, in accordance with a modification of the fifth embodiment of the present invention.

FIG. 16 is a cross-sectional view of a semiconductor substrate at a step in a modification of the fifth embodiment of the present invention. This modification comprises an additional step of making an opening in the silicon dioxide layer 32 just after the layer 32 is produced. As a result, the modified fifth embodiment of the present invention, is an improved process for producing of a mesa type semiconductor device utilizing a single crystalline semiconductor layer converted from a polycrystalline semiconductor layer by an energy ray irradiation process.

I claim:

1. A method for production of a semiconductor device comprising the steps of:
    (a) forming an insulating layer on the top surface of a semiconductor substrate;
    (b) forming a window in the insulating layer along a linear area defining crystal nuclei and a scribe line;
    (c) growing a non-single crystalline semiconductor layer on the top surface of the insulating layer;
    (d) irradiating the non-single crystalline semiconductor layer with an energy ray selected from a group including a photon beam, an ion beam and an electron beam, to form a single crystalline silicon layer in contact with the substrate at the crystal nuclei; and
    (e) forming semiconductor elements on the single crystalline silicon layer.

2. A method for production of a semiconductor device comprising the steps of:
    (a) forming an insulating layer on a substrate;
    (b) growing a non-single crystalline semiconductor layer on the top surface of the insulator layer;
    (c) oxidizing the non-single crystalline semiconductor layer to form device regions defined by the termally oxidized polycrystalline silicon; and
    (d) irradiating the non-single crystalline semiconductor layer with an energy ray selected from a group including a photon beam, an ion beam and an electron beam, to convert the non-single crystalline semiconductor layer into a single crystalline semiconductor layer.

3. A method for production of a semiconductor device having a non-single crystalline semiconductor layer of a first conductivity type formed on a substrate, comprising the steps of:
    (a) selectively covering an area of the non-single crystalline semiconductor layer with a mask made of a material which prevents radiated heat supplied in the form of radiation from passing therethrough;
    (b) depositing impurities having a second conductivity type, in the uncovered area of the non-single crystalline semiconductor layer; and
    (c) irradiating the uncovered area of the non-single crystalline semiconductor layer with an energy ray selected from a group including a photon beam, an ion beam and an electron beam, to diffuse the impurities into the uncovered area of the non-single crystalline semiconductor layer.

4. A method of production of a semiconductor device comprising the steps of:
    (a) selectively removing a region of a non-single crystalline semiconductor layer grown on an insulator substrate to form mesas of the non-single crystalline semiconductor layer; and (b) converting the mesas into single crystalline mesas and rounding the sides of the mesas by irradiating the mesas with an energy ray selected from a group including a photon beam, an ion beam and an electron beam.

5. A method for production of a semiconductor device as set forth in claim 1 or 2, wherein the top surface of said semiconductor substrate is planar and smooth.

6. A method for production of a semiconductor device as set forth in claim 1, further comprising the step of splitting said semiconductor substrate at said linear area.

7. A method for production of a semiconductor device as set forth in claim 6, wherein said substrate is split by means selected from a group comprising a laser and a diamond cutter.

8. A method for production of a semiconductor device as set forth in claim 1, further comprising the step of selectively, thermally oxidizing the single crystalline silicon layer to form device regions defined by the oxidized single crystalline silicon layer.

9. A method for production of a semiconductor device as set forth in claim 2 or 8, further comprising the step of forming one of a transistor and a resistor in respective ones of the device regions, to form a semiconductor device.

10. A method for production of a semiconductor device as set forth in claim 9, further comprising the steps of:
   (i) forming another insulating layer on the semiconductor device:
   (ii) forming another non-single crystalline semiconductor layer on the another insulating layer;
   (iii) converting the another non-single crystalline semiconductor layer into the another single crystalline semiconductor layer by irradiating the non-single crystalline layer with an energy ray selected from the group comprising a photon beam, an ion beam and an electron beam;
   (iv) forming another semiconductor device on the another single crystalline semiconductor layer; and
   (v) repeat steps (i) thru (iv) a predetermined number of times.

11. A method for production of a semiconductor device comprising the steps of:
   (a) forming an insulator layer on a substrate;
   (b) forming a polycrystalline silicon layer on the insulator layer;
   (c) selectively, thermally oxidizing the polycrystalline silicon layer to form device regions defined by the thermally oxidized polycrystalline silicon layer;
   (d) irradiating the polycrystalline silicon layer with an energy ray selected from a group including a photon beam, an ion beam and an electron beam, to form super-saturated molten polycrystalline silicon device regions;
   (e) rapidly cooling the molten polycrystalline silicon device regions;
   (f) forming one of a transistor and a resistor in respective ones of the device regions to form a semiconductor device; and
   (g) forming wiring on the semiconductor device.

12. A method for production of a semiconductor device comprising the steps of:
   (a) forming an insulating layer on a silicon substrate;
   (b) forming a first semiconductor layer on the insulating layer;
   (c) implanting first ions of a first conductivity type into the first semiconductor layer;
   (d) converting the first semiconductor layer into a semiconductor layer having a periodic structure by irradiating the first semiconductor layer with an energy ray selected from a group comprising a photon beam, an ion beam and an electron beam;
   (e) selectively forming a mask on the first semiconductor layer, the mask made of a material which prevents radiated heat from radiating to the first semiconductor layer;
   (f) selectively implanting second ions having a second conductivity type into selected areas of the first semiconductor layer defined by the mask; and
   (g) annealing the selected areas of the first semiconductor layer to uniformly diffuse the second ions into the first semiconductor layer in self-alignment with the mask.

13. A method for production of a semiconductor device as set forth in claim 12, further comprising the step of: before step (e), forming a layer comprising a material which does not substantially react with the first semiconductor layer on the first semiconductor layer, and wherein in step (e), the mask material comprises aluminum.

14. A method for production of a semiconductor device as set forth in claim 12, wherein, in step (b) the first semiconductor layer comprises one of a single crystalline semiconductor, an amorphous semiconductor and a polycrystalline semiconductor.

15. A method for production of a semiconductor device as set forth in claim 12 or 13, further comprising the steps of:
   (1) forming another insulating layer on the semiconductor device;
   (2) forming another semiconductor layer on the another insulating layer;
   (3) implanting first ions having the first conductivity type into the another semiconductor layer;
   (4) converting the another semiconductor layer into another semiconductor layer having a periodic structure by irradiating the another semiconductor layer with an energy ray selected from a group comprising a photon beam, an ion beam and an electron beam;
   (5) selectively forming a mask on the another semiconductor layer having a periodic structure, the mask made of a material which prevents radiated heat from radiating to the another semiconductor layer;
   (6) selectively implanting second ions having the second conductivity type into selected areas of the another semiconductor layer having a periodic structure defined by the mask;
   (7) annealing the selected areas of the semiconductor layer having a periodic structure to uniformly diffuse the second ions into the another semiconductor layer in self-alignment with the mask;
   (8) forming one of a transistor and a resistor in respective ones of the selected areas of the another semiconductor layer having a periodic structure, whereby another semiconductor device is formed;
   (9) forming wirings on the another semiconductor device; and
   (10) repeating steps (1) through (9) a predetermined number of times.

16. A method for production of a semiconductor device as set forth in claim 13, wherein the material which does not substantially react with the first semiconductor layer comprises silicon dioxide.

17. A method for production of a semiconductor device comprising the steps of:
   (a) thermally oxidizing a substrate;
   (b) forming a first polycrystalline silicon layer on the thermally oxidized surface of the substrate;
   (c) forming mesas comprising the first polycrystalline silicon layer;
   (d) converting the mesas into a single crystalline semiconductor mesas by irradiating the mesas with an energy ray selected from the group comprising a photon beam, an ion beam and an electron beam;
   (e) forming one of a transistor and a resistor in respective ones of the mesas;
   (f) forming a wiring layer operatively connecting selected one of the mesas to form a semiconductor device.

18. A method for production of a semiconductor device as set forth in claim 17, wherein step (a) further comprises forming windows in the thermally oxidized surface of the substrate.

19. A method for production of a semiconductor device according to claim 17 or 18 further comprising the steps of:
   (g) forming an insulator layer on the surface of the semiconductor device;
   (h) forming another polycrystalline silicon layer on the insulator layer;
   (i) forming mesas comprising the another polycrystalline silicon layer;
   (j) converting the mesas into a single crystalline semiconductor by irradiating the mesas with an energy ray selected from the group comprising a photon beam, an ion beam and an electron beam;
   (k) forming one of a transistor and a resistor in respective of ones of the mesas;
   (l) forming a wiring layer electrically connecting selected ones of the mesas, to form another semiconductor device;
   (m) repeating steps (g) through (l) a predetermined number of times.

20. A method for production of a semiconductor device comprising the steps of:
   (a) selectively, thermally oxidizing first regions of a substrate;
   (b) forming a polycrystalline silicon semiconductor layer on the substrate;
   (c) selectively oxidizing regions of the polycrystalline silicon semiconductor layer overlying the first regions of the substrate, to define polycrystalline silicon device regions;
   (d) converting the polycrystalline silicon device regions into a single crystalline layer by irradiating the polycrystalline device regions with an energy beam selected from the group comprising a photon beam, an ion beam and an electron beam;
   (e) selectively forming one of a transistor and a resistor in respective ones of the device regions; and
   (f) forming a wiring layer connecting selected ones of the device regions, to form a semiconductor device.

* * * * *

UNITED STATES PATENT AND TRADEMARK OFFICE
CERTIFICATE OF CORRECTION

PATENT NO. : 4,381,201

DATED : APRIL 26, 1983

INVENTOR(S) : JUNJI SAKURAI

It is certified that error appears in the above-identified patent and that said Letters Patent is hereby corrected as shown below:

```
Front page, [56] References Cited,
          "Kirkpatrick 148 .... 1.5/" should be
          --Kirkpatrick ....... 148/1.5--.

Col. 1, line numbering is off in Column 1.
        line 28, delete "of";
        line 36, "conting of" should be --converting--;
        line 64, delete "a".
Col. 2, line 1, delete "of";
        line 44, after "of" insert --the--;
        line 44, "nullifies" should be --nullify--.
Col. 3, line 5, after "acteristics" insert --cause--;
        line 10, "spliting" should be --splitting--;
        line 61, after "ray" insert --,--.
Col. 4, line 6, after "substrate" insert --,--;
        line 6, after "produced" insert --,--;
        line 24, "the" (first occurrence) should be
                 --to--;
        line 68, after "perform" insert --this--.
Col. 5, line 8, after "Thus" insert --,--;
        line 19, delete "of".
```

UNITED STATES PATENT AND TRADEMARK OFFICE
CERTIFICATE OF CORRECTION

PATENT NO. : 4,381,201

DATED : APRIL 26, 1983

INVENTOR(S) : JUNJI SAKURAI

It is certified that error appears in the above-identified patent and that said Letters Patent is hereby corrected as shown below:

```
Col. 6, line 27, "realize" should be --realizes--;
        line 46, "micrometers" should be
                 --micrometer--;
        line 58, after "Specifically" insert --,--;
        line 59, "FIG. 4," should be --FIG 4--;
        line 59, after "illustrates" insert --,--.
Col. 7, line 13, after "Further" insert --,--;
        line 63, after "devices" insert --,--.
Col. 8, line 3, "then" should be --when--;
        line 4, after "formed" insert --,--;
        line 7, after "8'" insert --,--;
        line 20, delete "on";
        line 23, after "package" insert --,--;
        line 57, "termally" should be --thermally--.
Col. 9, line 26, delete "for";
        line 36, after "semiconductor" insert --device--;
        line 40, after "substrate" insert --,--.
Col. 10, line 2, delete "of";
         line 19, delete "is";
         line 59, "Molten" should be --The molten--.
```

UNITED STATES PATENT AND TRADEMARK OFFICE
CERTIFICATE OF CORRECTION

PATENT NO. : 4,381,201

DATED : APRIL 26, 1983

INVENTOR(S) : JUNJI SAKURAI

It is certified that error appears in the above-identified patent and that said Letters Patent is hereby corrected as shown below:

Col. 11, line 3, "resistance" should be --and--;
line 4, "and" should be --resistance--.
Col. 12, line numbering is off in Column 12.
line 38, after "(c)" insert --selectively--;
line 39, "ter" should be --ther--;
line 65, "of" (first occurrence) should be --for--.

Signed and Sealed this

Twenty-eighth Day of February 1984

[SEAL]

Attest:

GERALD J. MOSSINGHOFF

Attesting Officer

Commissioner of Patents and Trademarks